US010256426B2

(12) United States Patent
Lv (10) Patent No.: US 10,256,426 B2
(45) Date of Patent: Apr. 9, 2019

(54) THIN-FILM TRANSISTOR ARRAY PANEL AND MANUFACTURING METHOD THEREOF

(71) Applicant: SHENZHEN CHINA STAR OPTOELECTRONICS TECHNOLOGY CO., LTD., Shenzhen, Guangdong (CN)

(72) Inventor: Xiaowen Lv, Guangdong (CN)

(73) Assignee: SHENZHEN CHINA STAR OPTOELECTRONOCS TECHNOLO9GY CO., LTD., Shenzhen, Guangdong (CN)

( * ) Notice: Subject to any disclaimer, the term of this patent is extended or adjusted under 35 U.S.C. 154(b) by 147 days.

(21) Appl. No.: 15/114,864

(22) PCT Filed: Apr. 1, 2016

(86) PCT No.: PCT/CN2016/078373
§ 371 (c)(1),
(2) Date: Jul. 28, 2016

(87) PCT Pub. No.: WO2017/152445
PCT Pub. Date: Sep. 14, 2017

(65) Prior Publication Data
US 2018/0090703 A1    Mar. 29, 2018

(30) Foreign Application Priority Data
Mar. 7, 2016  (CN) .......................... 2016 1 0125243

(51) Int. Cl.
*H01L 21/77*   (2017.01)
*H01L 27/12*   (2006.01)
(Continued)

(52) U.S. Cl.
CPC ........ *H01L 51/0508* (2013.01); *G02F 1/1368* (2013.01); *H01L 21/77* (2013.01);
(Continued)

(58) Field of Classification Search
CPC . H01L 51/56; H01L 51/0072; H01L 51/0097; H01L 51/5012; H01L 51/5056
(Continued)

(56) References Cited

U.S. PATENT DOCUMENTS 9,530,799 B2 * 12/2016 Wang ................ H01L 29/78621
2002/0125535 A1    9/2002 Ueda
(Continued)

FOREIGN PATENT DOCUMENTS

CN    102194890 A    9/2011
CN    103151388 A    6/2013

*Primary Examiner* — Andy Huynh
(74) *Attorney, Agent, or Firm* — Soroker Agmon Nordman (57) ABSTRACT

A thin-film transistor array panel and a manufacturing method thereof are disclosed. The thin-film transistor array panel has a polysilicon layer including a first region, a second region and a third region. The second region includes a fourth region, a fifth region and a sixth region. The third region includes a seventh region, an eighth region and ninth region. The sixth, the fourth, the ninth and the seventh regions are doped with first, second, third and fourth ions, respectively. In a thin-film transistor of the thin-film transistor array panel, a gate electrode, a source electrode and a drain electrode thereof correspond to the first, the sixth and the ninth regions, respectively. The device is able to reduce leakage current in the thin-film transistor.

11 Claims, 6 Drawing Sheets

(51) Int. Cl.
  *H01L 27/32*   (2006.01)
  *H01L 51/05*   (2006.01)
  *G02F 1/1368*  (2006.01)
  *H01L 29/786*  (2006.01)

(52) U.S. Cl.
  CPC .......... *H01L 27/12* (2013.01); *H01L 27/3262* (2013.01); *H01L 29/786* (2013.01); *H01L 29/78621* (2013.01); *H01L 29/78675* (2013.01)

(58) Field of Classification Search
  USPC ....................................................... 257/192
  See application file for complete search history.

(56) References Cited

U.S. PATENT DOCUMENTS

| | | |
|---|---|---|
| 2011/0220878 A1 | 9/2011 | Lee |
| 2017/0047352 A1 | 2/2017 | Wang |

* cited by examiner

THIN-FILM TRANSISTOR ARRAY PANEL AND MANUFACTURING METHOD THEREOF

BACKGROUND OF THE INVENTION

Field of the Invention

The present invention relates to the technical field of display technology, and more particularly to a thin-film transistor array panel and a manufacturing method thereof.

Description of the Related Art

A traditional display panel usually uses TFTs (thin-film transistors) as switching devices.

An LDD (Lightly-Doped Drain) structure is presently the main stream structure for TFT, which can effectively restrain hot carrier effect (HCE).

In practice, the inventor found out that there is at least a problem existing in the traditional technology:

The leakage current in the traditional TFT with such LDD structure is large, which results in reduction of output current of the TFT.

Hence, it is necessary to provide a new technical solution to overcome the aforementioned technical problems.

SUMMARY THE INVENTION

An objective of the present invention is to provide a thin-film transistor array panel and a manufacturing method thereof where the leakage current of the thin-film transistors in the thin-film transistor array panel is reduced.

In order to solve the above technical problem, the technical solution of the present invention is as follows:

A thin-film transistor array panel including: a substrate; a buffer layer; a first insulating layer; a plurality of thin-film transistors, each of which includes: a polysilicon layer disposed between the buffer layer and the first insulating layer; a gate electrode mounted on the first insulating layer; a source electrode; and a drain electrode; a second insulating layer; a display device layer; wherein the polysilicon layer includes a first region, a second region and a third region; and the first region is disposed between the second region and the third region; the second region includes a fourth region, a fifth region and a sixth region; the fifth region is disposed between the fourth region and the sixth region; the fourth region is disposed between the first region and the fifth region; the sixth region is doped with first ions; the fourth region is doped with second ions; the third region includes a seven region, an eighth region and a ninth region; the eighth region is disposed between the seventh region and the ninth region; the seventh region is disposed between the first region and the eighth region; the ninth region is doped with third ions; the seventh region is doped with fourth ions; the source electrode is in contact with a portion of the polysilicon layer in the sixth region; the drain electrode is in contact with a portion of the polysilicon layer in the ninth region; a portion of the polysilicon layer in the second region and/or a portion of the polysilicon layer in the third region are used to reduce leakage current of the thin-film transistor; a portion of the polysilicon layer in the fifth region separates a portion of the polysilicon layer in the sixth region and a portion of the polysilicon layer in the fourth region; a portion of the polysilicon layer in the eighth region separates a portion of the polysilicon layer in the seventh region and a portion of the polysilicon layer in the ninth region.

In the thin-film transistor array panel, in the polysilicon layer, a doping concentration of the first ions in the sixth region and a doping concentration of the second ions in the fourth region form a first gradient concentration distribution; a doping concentration of the third ions in the ninth region and a doping concentration of the fourth ions in the seventh region form a second gradient concentration distribution.

In the thin-film transistor array panel, in the polysilicon layer, the doping concentration of the first ions in the sixth region is greater than the doping concentration of the second ions in the fourth region; the doping concentration of the third ions in the ninth region is greater than the doping concentration of the fourth ions in the seventh region.

In the thin-film transistor array panel, the first ions, the second ions, the third ions and the fourth ions are all P-type ions.

The present invention further provides a thin-film transistor array panel including: a substrate; a buffer layer; a first insulating layer; a plurality of thin-film transistors, each of which includes: a polysilicon layer disposed between the buffer layer and the first insulating layer; a gate electrode mounted on the first insulating layer; a source electrode; and a drain electrode; a second insulating layer; a display device layer; wherein the polysilicon layer includes a first region, a second region and a third region; and the first region is disposed between the second region and the third region; the second region includes a fourth region, a fifth region and a sixth region; the fifth region is disposed between the fourth region and the sixth region; the fourth region is disposed between the first region and the fifth region; the sixth region is doped with first ions; the fourth region is doped with second ions; the third region includes a seven region, an eighth region and a ninth region; the eighth region is disposed between the seventh region and the ninth region; the seventh region is disposed between the first region and the eighth region; the ninth region is doped with third ions; the seventh region is doped with fourth ions; the source electrode is in contact with a portion of the polysilicon layer in the sixth region; the drain electrode is in contact with a portion of the polysilicon layer in the ninth region.

In the thin-film transistor array panel, a portion of the polysilicon layer in the second region and/or a portion of the polysilicon layer in the third region are used to reduce leakage current of the thin-film transistor.

In the thin-film transistor array panel, in the polysilicon layer, a doping concentration of the first ions in the sixth region and a doping concentration of the second ions in the fourth region form a first gradient concentration distribution; a doping concentration of the third ions in the ninth region and a doping concentration of the fourth ions in the seventh region form a second gradient concentration distribution.

In the thin-film transistor array panel, in the polysilicon layer, the doping concentration of the first ions in the sixth region is greater than the doping concentration of the second ions in the fourth region; the doping concentration of the third ions in the ninth region is greater than the doping concentration of the fourth ions in the seventh region.

In the thin-film transistor array panel, the first ions, the second ions, the third ions and the fourth ions are all P-type ions.

In the thin-film transistor array panel, a portion of the polysilicon layer in the fifth region separates a portion of the polysilicon layer in the sixth region and a portion of the polysilicon layer in the fourth region; a portion of the polysilicon layer in the eighth region separates a portion of the polysilicon layer in the seventh region and a portion of the polysilicon layer in the ninth region.

In the thin-film transistor array panel, the first ions have a constant doping concentration in the portion of the polysilicon layer in the sixth region; the second ions have a constant doping concentration in the portion of the polysilicon layer in the fourth region; the third ions have a constant doping concentration in the portion of the polysilicon layer in the ninth region; the fourth ions have a constant doping concentration in the portion of the polysilicon layer in the seventh region.

In the thin-film transistor array panel, the first ions have a third gradient doping concentration in the portion of the polysilicon layer in the sixth region; the second ions have a fourth gradient doping concentration in the portion of the polysilicon layer in the fourth region; the third ions have a fifth gradient doping concentration in the portion of the polysilicon layer in the ninth region; the fourth ions have a sixth gradient doping concentration in the portion of the polysilicon layer in the seventh region.

A manufacturing method of the foregoing thin-film transistor array panel includes steps of: A: forming a first panel, wherein the first panel includes the substrate, the buffer layer, the polysilicon layer, the first insulating layer and the gate electrode, wherein the polysilicon layer includes a first region, a second region and a third region; the first region is positioned between the second region and the third region; a position of the gate electrode corresponds to the first region; B: doping the polysilicon layer with the first ions, the second ions, the third ions and the fourth ions through portions of the first insulating layer in the second region and the third region so that the sixth region within the second region and the ninth region within the third region are doped with the first ions and the third ions, respectively; and so that the fourth region within the second region and the seventh region within the third region are doped with the second ions and the fourth ions, respectively; C: forming the source electrode, the drain electrode, the second insulating layer and the display device layer on the first panel, wherein the source electrode is in contact with a portion of the polysilicon layer in the sixth region; the drain electrode is in contact with a portion of the polysilicon layer in the ninth region.

In the manufacturing method of the foregoing thin-film transistor array panel, a portion of the polysilicon layer in the second region and/or a portion of the polysilicon layer in the third region are used to reduce leakage current of the thin-film transistor.

In the manufacturing method of the foregoing thin-film transistor array panel, in the polysilicon layer, a doping concentration of the first ions in the sixth region and a doping concentration of the second ions in the fourth region form a first gradient concentration distribution; a doping concentration of the third ions in the ninth region and a doping concentration of the fourth ions in the seventh region form a second gradient concentration distribution.

In the manufacturing method of the foregoing thin-film transistor array panel, in the polysilicon layer, the doping concentration of the first ions in the sixth region is greater than the doping concentration of the second ions in the fourth region; the doping concentration of the third ions in the ninth region is greater than the doping concentration of the fourth ions in the seventh region.

In the manufacturing method of the foregoing thin-film transistor array panel, the first ions, the second ions, the third ions and the fourth ions are all P-type ions.

In the manufacturing method of the foregoing thin-film transistor array panel, a portion of the polysilicon layer in the fifth region separates a portion of the polysilicon layer in the sixth region and a portion of the polysilicon layer in the fourth region; a portion of the polysilicon layer in the eighth region separates a portion of the polysilicon layer in the seventh region and a portion of the polysilicon layer in the ninth region.

In the manufacturing method of the foregoing thin-film transistor array panel, the first ions have a constant doping concentration in the portion of the polysilicon layer in the sixth region; the second ions have a constant doping concentration in the portion of the polysilicon layer in the fourth region; the third ions have a constant doping concentration in the portion of the polysilicon layer in the ninth region; the fourth ions have a constant doping concentration in the portion of the polysilicon layer in the seventh region.

In the manufacturing method of the foregoing thin-film transistor array panel, the first ions have a third gradient doping concentration in the portion of the polysilicon layer in the sixth region; the second ions have a fourth gradient doping concentration in the portion of the polysilicon layer in the fourth region; the third ions have a fifth gradient doping concentration in the portion of the polysilicon layer in the ninth region; the fourth ions have a sixth gradient doping concentration in the portion of the polysilicon layer in the seventh region.

Compared with the conventional technology, the present invention is able to reduce the leakage current of the thin-film transistors in the thin-film transistor array panel.

In order to make the contents of the present invention more easily understood, the preferred embodiments of the present invention are described in detail in cooperation with accompanying drawings as follows:

BRIEF DESCRIPTION OF THE DRAWINGS

FIG. 5 is also a schematic cross sectional view of a thin-film transistor array panel according to an embodiment of the present invention.

DETAILED DESCRIPTION OF THE PREFERRED EMBODIMENTS

The foregoing objects, features and advantages adopted by the present invention can be best understood by referring to the following detailed description of the preferred embodiments and the accompanying drawings. Furthermore, the directional terms described in the present invention, such as upper, lower, front, rear, left, right, inner, outer, side and etc., are only directions referring to the accompanying drawings, so that the used directional terms are used to describe and understand the present invention, but the present invention is not limited thereto. The word "embodiment" used in the specification refers to an instance, an example, or an illustration. Moreover, the article "a" used in the specification and claims may generally be explained as "one or more", unless otherwise specified or clearly directed to a singular form according to the context.

The thin-film transistor array panel of the present invention may be used in a TFT-LCD (Thin Film Transistor Liquid Crystal Display) device or an OLED (Organic Light Emitting Diode) display device.

Figure 5:
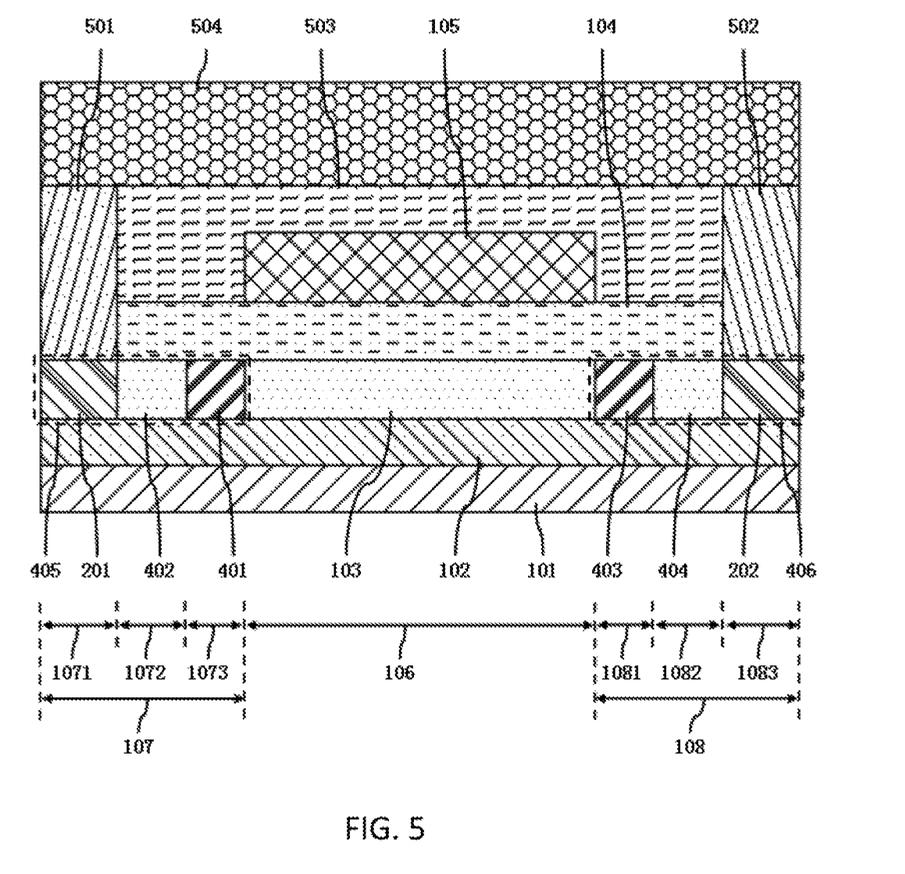

With reference to FIG. 5, FIG. 5 is a schematic cross sectional view of a thin-film transistor array panel according to an embodiment of the present invention The thin-film transistor array panel of the present invention includes a substrate 101, a buffer layer 102, a first insulating layer 104, a plurality of thin-film transistors, a second insulating layer 503, and a display device layer 504.

Each of the thin-film transistors includes a polysilicon layer 103, a gate electrode 105, a source electrode 501, and a drain electrode 502. The polysilicon layer 103 is mounted between the buffer layer 102 and the first insulating layer 104. The gate electrode 105 is mounted on the first insulating layer 104.

The polysilicon layer 103 includes a first region 106, a second region 107 and a third region 108. The first region 106 is disposed between the second region 107 and the third region 108. The second region 107 includes a fourth region 1073, a fifth region 1072 and a sixth region 1071. The fifth region 1072 is disposed between the fourth region 1073 and the sixth region 1071. The fourth region 1073 is disposed between the first region 106 and the fifth region 1072. The sixth region 1071 is doped with first ions. The fourth region 1073 is doped with second ions. The third region 108 includes a seventh region 1081, an eighth region 1082 and a ninth region 1083. The eighth region 1082 is disposed between the seventh region 1081 and the ninth region 1083. The seventh region 1081 is disposed between the first region 106 and the eighth region 1082. The ninth region 1083 is doped with third ions, and the seventh region 1081 is doped with fourth ions.

The position of the gate electrode 105 corresponds to the first region 106. The source electrode 501 is in contact with a portion 201 of the polysilicon layer 103 in the sixth region 1071; the drain electrode 502 is in contact with a portion 202 of the polysilicon layer 103 in the ninth region 1083.

In thin-film transistor array panel of the present invention, a portion 405 of the polysilicon layer 103 in the second region 107 and/or a portion 406 of the polysilicon layer 103 in the third region 108 are used to reduce leakage current of the thin-film transistor.

In thin-film transistor array panel of the present invention, a doping concentration of the first ions in the sixth region 1071 and a doping concentration of the second ions in the fourth region 1073 form a first gradient concentration distribution in the polysilicon layer 103; a doping concentration of the third ions in the ninth region 1083 and a doping concentration of the fourth ions in the seventh region 1081 form a second gradient concentration distribution in the polysilicon layer 103.

In thin-film transistor array panel of the present invention, the doping concentration of the first ions in the sixth region 1071 in the polysilicon layer 103 is greater than the doping concentration of the second ions in the fourth region 1073 in the polysilicon layer 103; the doping concentration of the third ions in the ninth region 1083 in the polysilicon layer 103 is greater than the doping concentration of the fourth ions in the seventh region 1081 in the polysilicon layer 103.

A portion 402 of the polysilicon layer 103 in the fifth region 1072 separates a portion 201 of the polysilicon layer 103 in the sixth region 1071 and a portion 401 of the polysilicon layer 103 in the fourth region 1073; a portion 404 of the polysilicon layer 103 in the eighth region 1082 separates a portion 403 of the polysilicon layer 103 in the seventh region 1081 and a portion 202 of the polysilicon layer 103 in the ninth region 1083.

In the present technical solution, since in the polysilicon layer 103, the doping concentration of the first ions in the sixth region 1071 is greater than the doping concentration of the second ions in the fourth region 1073, and the doing concentration of the third ions in the ninth region 1083 is greater than the doping concentration of the fourth ions in the seventh region 1081, an energy barrier can be lowered so as to reduce the leakage current of the thin-film transistor; moreover, parasitic capacitance and resistance formed by the LDD (Lightly Doped Drain) structure of the thin-film transistor can also be reduced.

In thin-film transistor array panel of the present invention, the first ions, the second ions, the third ions and the fourth ions are all P-type ions.

The first ions and the third ions may be injected into the portion 201 in the sixth region 1071 and the portion 202 in the ninth region 1083 of the polysilicon layer 103 during a first ion mask process. The second ions and the fourth ions may be injected into the portion 401 in the fourth region 1073 and the portion 403 in the seventh region 1081 of the polysilicon layer 103 during a second ion mask process.

The first ions have a constant (uniform) doping concentration in the portion 201 of the polysilicon layer 103 in the sixth region 1071. The second ions have a constant (uniform) doping concentration in the portion 401 of the polysilicon layer 103 in the fourth region 1073. The third ions have a constant (uniform) doping concentration in the portion 202 of the polysilicon layer 103 in the ninth region 1083. The fourth ions have a constant (uniform) doping concentration in the portion 403 of the polysilicon layer 103 in the seventh region 1081.

As an improvement, the first ions have a third gradient doping concentration (linear or nonlinear) in the portion 201 of the polysilicon layer 103 in the sixth region 1071; the second ions have a fourth gradient doping concentration (linear or nonlinear) in the portion 401 of the polysilicon layer 103 in the fourth region 1073; the third ions have a fifth gradient doping concentration (linear or nonlinear) in the portion 202 of the polysilicon layer in the ninth region 1083; the fourth ions have a sixth gradient doping concentration (linear or nonlinear) in the portion 403 of the polysilicon layer 103 in the seventh region 1081.

Figure 6:
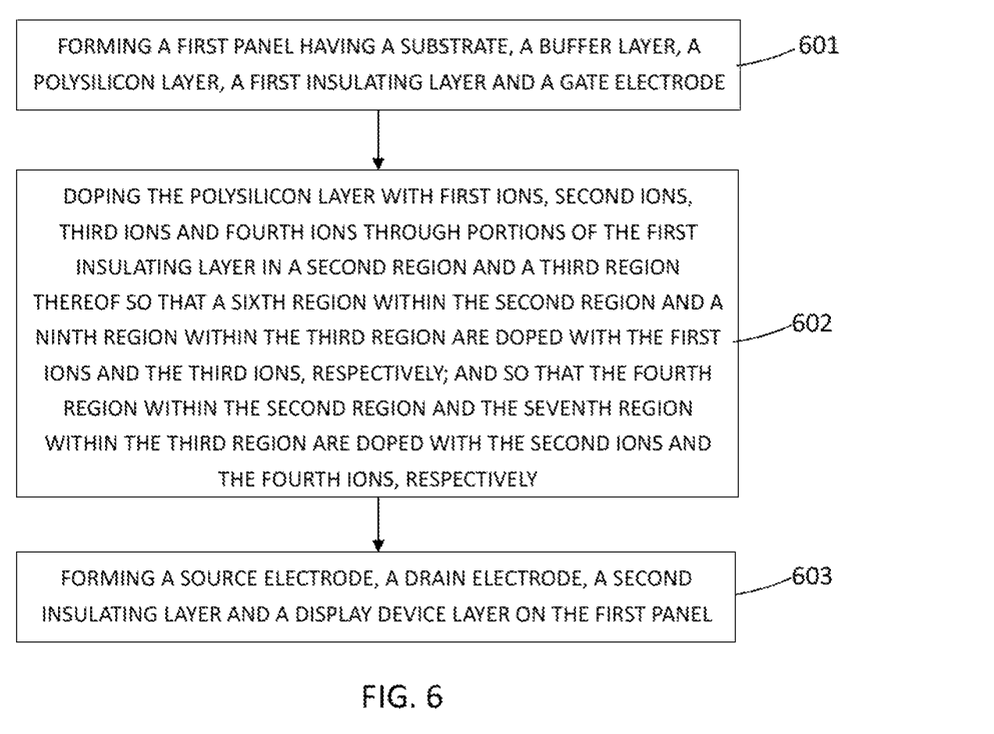
FIG. 6 is a flow chart of a manufacturing method of a thin-film transistor array panel according to an embodiment of the invention.

With reference to FIGS. 1 to 6, FIGS. 1 to 5 are schematic views illustrating the manufacturing method of the thin-film transistor array panel according to an embodiment of the present invention; and FIG. 6 is a flow chart of the manufacturing method of the thin-film transistor array panel according to an embodiment of the invention.

Figure 1:
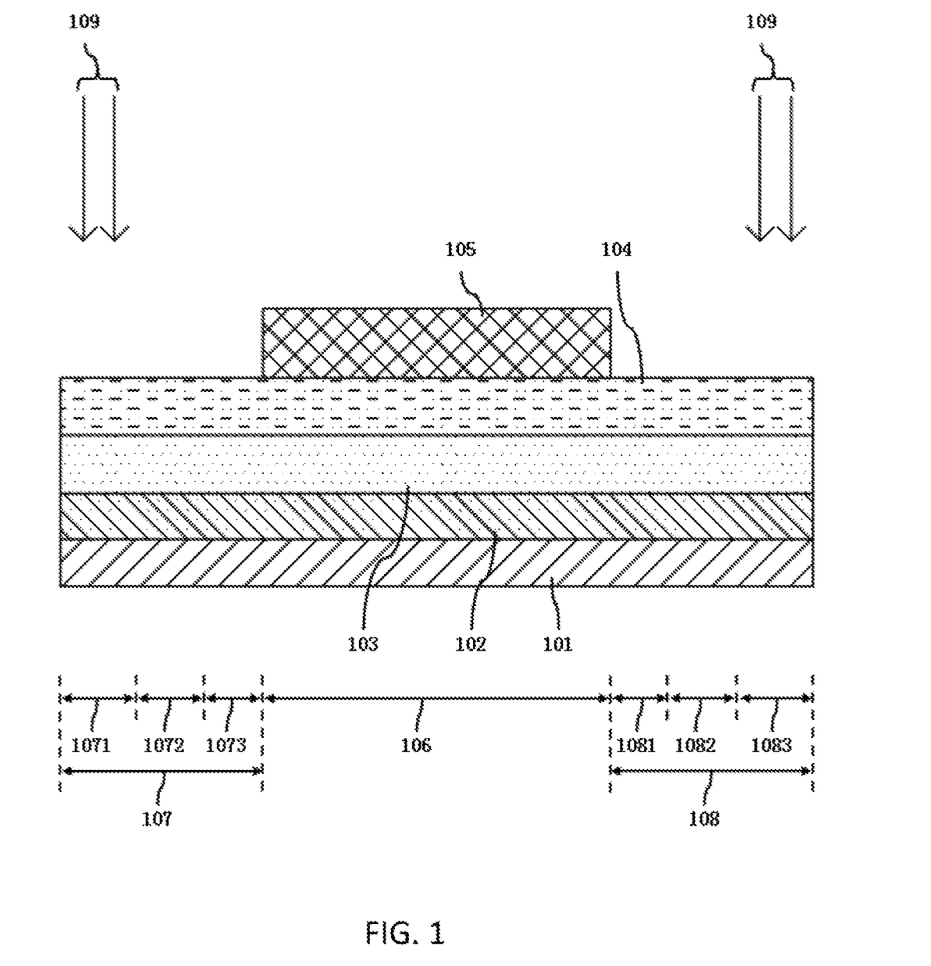
FIGS. 1 to 5 are schematic views illustrating a manufacturing method of a thin-film transistor array panel according to an embodiment of the present invention.
Figure 2:
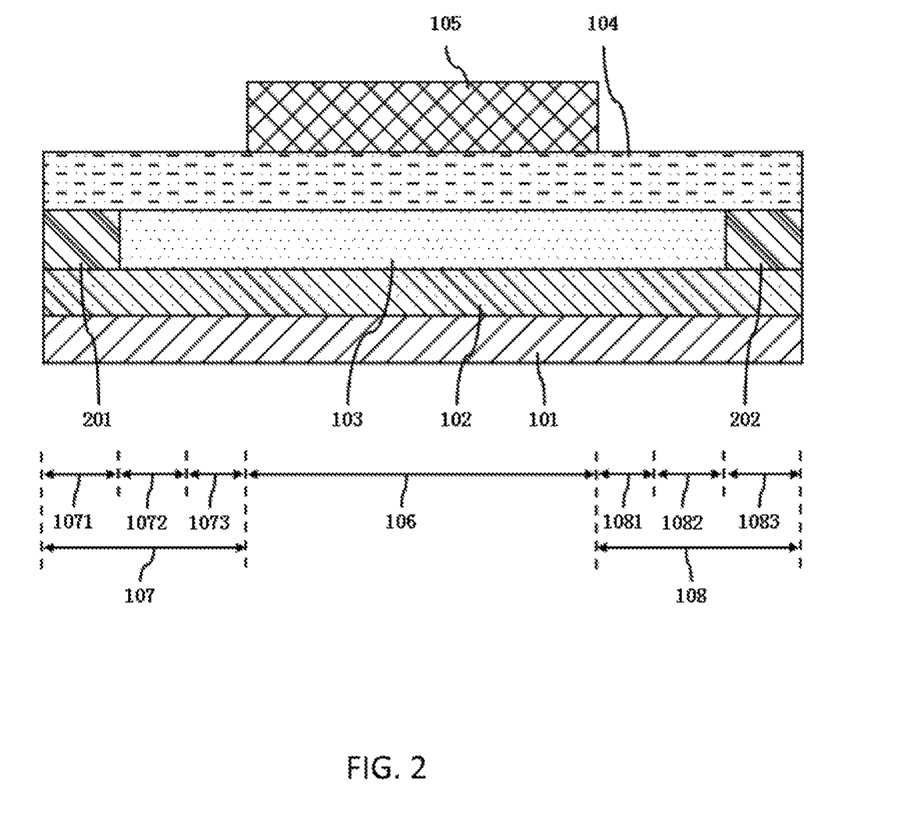
Figure 3:
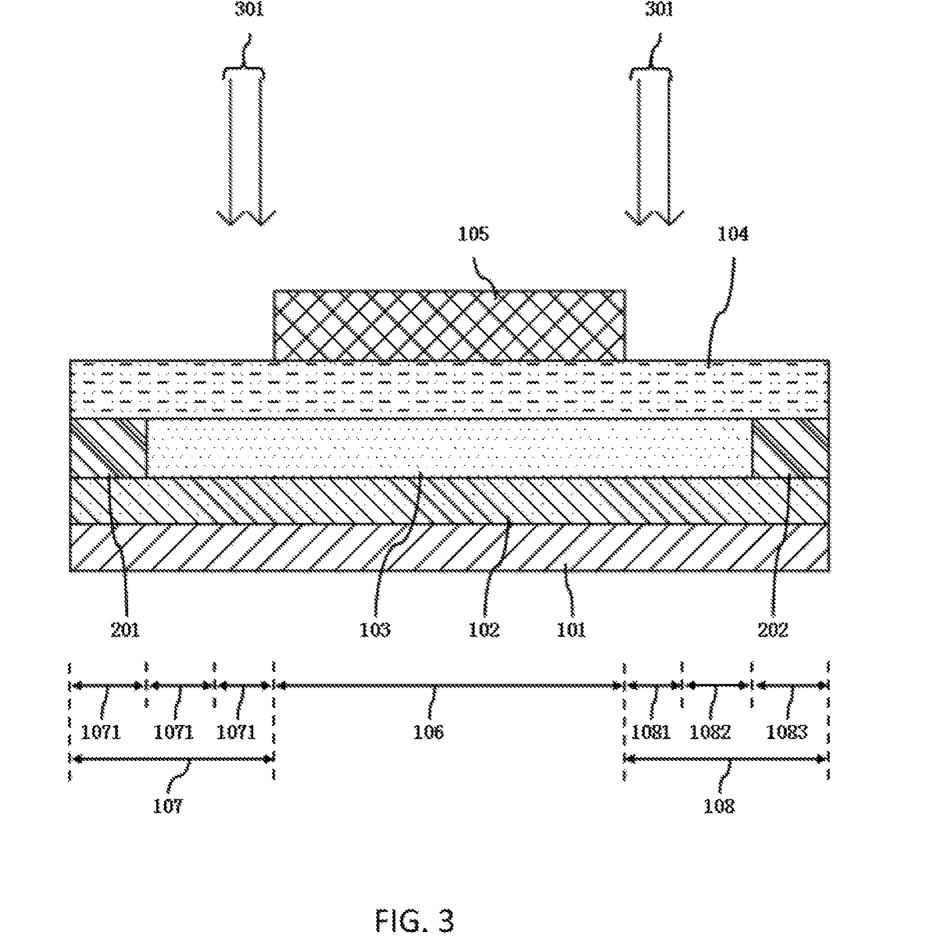
Figure 4:
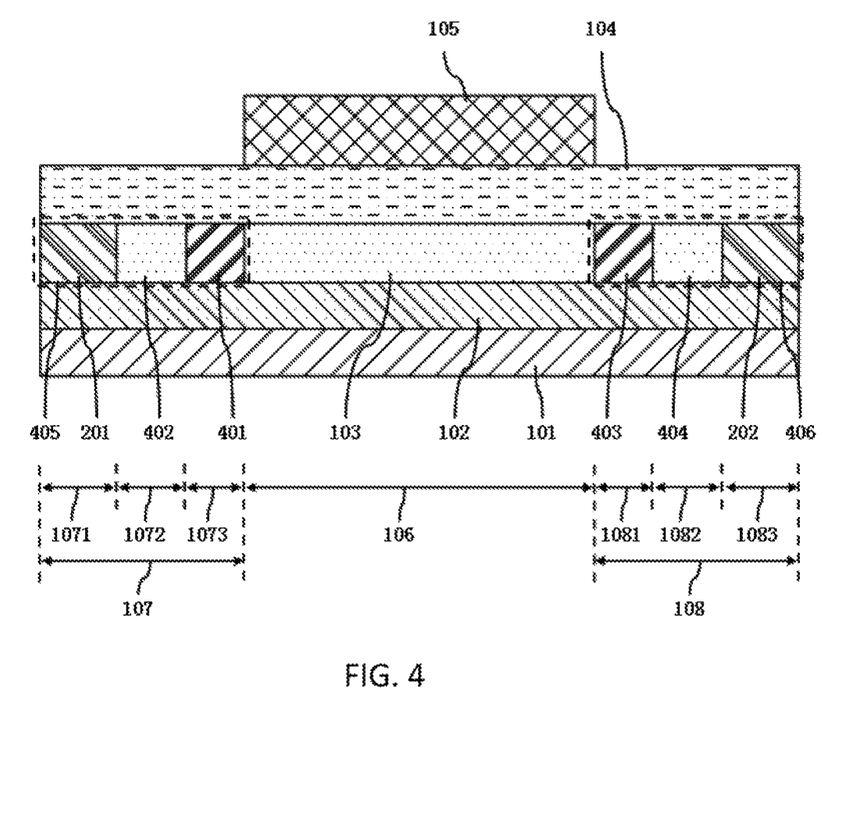

The manufacturing method of the thin-film transistor array panel of the present invention includes the following steps:

A (Step 601): forming a first panel, wherein the first panel includes the substrate 101, the buffer layer 102, the polysilicon layer 103, the first insulating layer 104 and the gate electrode 105, wherein the polysilicon layer 103 includes a first region 106, a second region 107 and a third region 108; the first region 106 is positioned between the second region 107 and the third region 108; the position of the gate electrode corresponds to the first region 106.

B (Step 602): doping the polysilicon layer 103 with the first ions, the second ions, the third ions and the fourth ions through portions (405, 406) of the first insulating layer 104 in the second region 107 and the third region 108 so that the sixth region 1071 within the second region 107 and the ninth region 1083 within the third region 108 are doped with the first ions and the third ions, respectively; and so that the fourth region 1073 within the second region 107 and the seventh region 1081 within the third region 108 are doped with the second ions and the fourth ions, respectively.

C (Step 603): forming the source electrode 501, the drain electrode 502, the second insulating layer 503 and the display device layer 504 on the first panel, wherein the source electrode 501 is in contact with a portion 201 of the polysilicon layer 103 in the sixth region 1071; the drain electrode 502 is in contact with a portion 202 of the polysilicon layer 103 in the ninth region 1083.

In the manufacturing method of the thin-film transistor array panel of the present invention, a portion 405 of the polysilicon layer 103 in the second region 107 and/or a portion 406 of the polysilicon layer 103 in the third region 108 are used to reduce leakage current of the thin-film transistor.

In the manufacturing method of the thin-film transistor array panel of the present invention, a doping concentration of the first ions in the sixth region 1071 and a doping concentration of the second ions in the fourth region 1073 form a first gradient concentration distribution in the polysilicon layer 103; a doping concentration of the third ions in the ninth region 1083 and a doping concentration of the fourth ions in the seventh region 1081 form a second gradient concentration distribution in the polysilicon layer 103.

In the manufacturing method of the thin-film transistor array panel of the present invention, the doping concentration of the first ions in the sixth region 1071 in the polysilicon layer 103 is greater than the doping concentration of the second ions in the fourth region 1073 in the polysilicon layer 103; the doping concentration of the third ions in the ninth region 1083 in the polysilicon layer 103 is greater than the doping concentration of the fourth ions in the seventh region 1081 in the polysilicon layer 103.

A portion 402 of the polysilicon layer 103 in the fifth region 1072 separates a portion 201 of the polysilicon layer 103 in the sixth region 1071 and a portion 401 of the polysilicon layer 103 in the fourth region 1073; a portion 404 of the polysilicon layer 103 in the eighth region 1082 separates a portion 403 of the polysilicon layer 103 in the seventh region 1081 and a portion 202 of the polysilicon layer 103 in the ninth region 1083.

In the present technical solution, since in the polysilicon layer 103, since in the polysilicon layer 103, the doping concentration of the first ions in the sixth region 1071 is greater than the doping concentration of the second ions in the fourth region 1073, and the doing concentration of the third ions in the ninth region 1083 is greater than the doping concentration of the fourth ions in the seventh region 1081, an energy barrier can be lowered so as to reduce the leakage current of the thin-film transistor; moreover, parasitic capacitance and resistance formed by the LDD (Lightly Doped Drain) structure of the thin-film transistor can also be reduced.

In the manufacturing method of the thin-film transistor array panel of the present invention, the first ions, the second ions, the third ions and the fourth ions are all P-type ions.

The first ions and the third ions may be injected into the portion 201 in the sixth region 1071 and the portion 202 in the ninth region 1083 of the polysilicon layer 103 during a first ion mask process. The second ions and the fourth ions may be injected into the portion 401 in the fourth region 1073 and the portion 403 in the seventh region 1081 of the polysilicon layer 103 during a second ion mask process.

The first ions have a constant (uniform) doping concentration in the portion 201 of the polysilicon layer 103 in the sixth region 1071. The second ions have a constant (uniform) doping concentration in the portion 401 of the polysilicon layer 103 in the fourth region 1073. The third ions have a constant (uniform) doping concentration in the portion 202 of the polysilicon layer 103 in the ninth region 1083. The fourth ions have a constant (uniform) doping concentration in the portion 403 of the polysilicon layer 103 in the seventh region 1081.

As an improvement, the first ions have a third gradient doping concentration (linear or nonlinear) in the portion 201 of the polysilicon layer 103 in the sixth region 1071; the second ions have a fourth gradient doping concentration (linear or nonlinear) in the portion 401 of the polysilicon layer 103 in the fourth region 1073; the third ions have a fifth gradient doping concentration (linear or nonlinear) in the portion 202 of the polysilicon layer in the ninth region 1083; the fourth ions have a sixth gradient doping concentration (linear or nonlinear) in the portion 403 of the polysilicon layer 103 in the seventh region 1081.

With the foregoing technical solutions, the present invention is able to reduce the leakage current of the thin-film transistors of the thin-film transistor array panel.

Although the present disclosure has been shown and described with respect to one or more implementations, a person skilled in the art will conceive of equivalent alterations and modifications after reading and understanding this specification and the accompanying drawings. The present disclosure includes all such modifications and alterations, and is only limited by the scope of the appended claims. In particular, regard to the various functions performed by the above described components (for example, elements and resources), the term used to describe such a component is intended to correspond to any component (unless otherwise indicated) that performs the specified function of the described component (for example, the component is functionally equivalent), even if not structurally equivalent to the disclosed structure which performs the function in the exemplary implementations of the present disclosure illustrated herein. In addition, while a particular feature of the present disclosure has been disclosed with respect to only one of several implementations, such feature may be combined with one or more other features of other implementations that may be desired by and beneficial to any given or particular application. Furthermore, to the extent that the terms "include", "have", "contain", and variants thereof are used in either the embodiments or the claims, these terms are intended imply inclusion similar to the term "comprise".

In conclusion, although the present invention has been described with reference to the preferred embodiment thereof, it is apparent to those skilled in the art that a variety of modifications and changes may be made without departing from the scope of the present invention which is intended to be defined by the appended claims.

What is claimed is:

1. A thin-film transistor array panel comprising:
a substrate;
a buffer layer;
a first insulating layer;
a plurality of thin-film transistors, each of which includes:
   a polysilicon layer disposed between the buffer layer and the first insulating layer;
   a gate electrode mounted on the first insulating layer;
   a source electrode; and
   a drain electrode;
a second insulating layer;
a display device layer; wherein
the polysilicon layer includes a first region, a second region and a third region; and the first region is disposed between the second region and the third region;

the second region includes a fourth region, a fifth region and a sixth region; the fifth region is disposed between the fourth region and the sixth region; the fourth region is disposed between the first region and the fifth region; the sixth region is doped with first ions; the fourth region is doped with second ions;

the third region includes a seven region, an eighth region and a ninth region; the eighth region is disposed between the seventh region and the ninth region; the seventh region is disposed between the first region and the eighth region; the ninth region is doped with third ions; the seventh region is doped with fourth ions;

the position of the gate electrode corresponds to the first region; the source electrode is in contact with a portion of the polysilicon layer in the sixth region; the drain electrode is in contact with a portion of the polysilicon layer in the ninth region;

a portion of the polysilicon layer in the second region and/or a portion of the polysilicon layer in the third region are used to reduce leakage current of the thin-film transistor;

a portion of the polysilicon layer in the fifth region separates a portion of the polysilicon layer in the sixth region and a portion of the polysilicon layer in the fourth region; a portion of the polysilicon layer in the eighth region separates a portion of the polysilicon layer in the seventh region and a portion of the polysilicon layer in the ninth region; wherein the first ions have a third gradient doping concentration in the portion of the polysilicon layer in the sixth region;

the second ions have a fourth gradient doping concentration in the portion of the polysilicon layer in the fourth region;

the third ions have a fifth gradient doping concentration in the portion of the polysilicon layer in the ninth region;

the fourth ions have a sixth gradient doping concentration in the portion of the polysilicon layer in the seventh region.

2. The thin-film transistor array panel as claimed in claim 1, wherein in the polysilicon layer, a doping concentration of the first ions in the sixth region and a doping concentration of the second ions in the fourth region form a first gradient concentration distribution; a doping concentration of the third ions in the ninth region and a doping concentration of the fourth ions in the seventh region form a second gradient concentration distribution.

3. The thin-film transistor array panel as claimed in claim 2, wherein in the polysilicon layer, the doping concentration of the first ions in the sixth region is greater than the doping concentration of the second ions in the fourth region; the doping concentration of the third ions in the ninth region is greater than the doping concentration of the fourth ions in the seventh region.

4. The thin-film transistor array panel as claimed in claim 3, wherein the first ions, the second ions, the third ions and the fourth ions are all P-type ions.

5. A thin-film transistor array panel comprising:
a substrate;
a buffer layer;
a first insulating layer;
a plurality of thin-film transistors, each of which includes:
   a polysilicon layer disposed between the buffer layer and the first insulating layer;
   a gate electrode mounted on the first insulating layer;
   a source electrode; and
   a drain electrode;
a second insulating layer;

a display device layer; wherein
the polysilicon layer includes a first region, a second region and a third region; and the first region is disposed between the second region and the third region;

the second region includes a fourth region, a fifth region and a sixth region; the fifth region is disposed between the fourth region and the sixth region; the fourth region is disposed between the first region and the fifth region; the sixth region is doped with first ions; the fourth region is doped with second ions;

the third region includes a seven region, an eighth region and a ninth region; the eighth region is disposed between the seventh region and the ninth region; the seventh region is disposed between the first region and the eighth region; the ninth region is doped with third ions; the seventh region is doped with fourth ions;

the source electrode is in contact with a portion of the polysilicon layer in the sixth region; the drain electrode is in contact with a portion of the polysilicon layer in the ninth region; wherein the first ions have a third gradient doping concentration in the portion of the polysilicon layer in the sixth region;

the second ions have a fourth gradient doping concentration in the portion of the polysilicon layer in the fourth region;

the third ions have a fifth gradient doping concentration in the portion of the polysilicon layer in the ninth region;

the fourth ions have a sixth gradient doping concentration in the portion of the polysilicon layer in the seventh region.

6. The thin-film transistor array panel as claimed in claim 5, wherein a portion of the polysilicon layer in the second region and/or a portion of the polysilicon layer in the third region are used to reduce leakage current of the thin-film transistor.

7. The thin-film transistor array panel as claimed in claim 6, wherein in the polysilicon layer, a doping concentration of the first ions in the sixth region and a doping concentration of the second ions in the fourth region form a first gradient concentration distribution; a doping concentration of the third ions in the ninth region and a doping concentration of the fourth ions in the seventh region form a second gradient concentration distribution.

8. The thin-film transistor array panel as claimed in claim 7, wherein in the polysilicon layer, the doping concentration of the first ions in the sixth region is greater than the doping concentration of the second ions in the fourth region; the doping concentration of the third ions in the ninth region is greater than the doping concentration of the fourth ions in the seventh region.

9. The thin-film transistor array panel as claimed in claim 8, wherein the first ions, the second ions, the third ions and the fourth ions are all P-type ions.

10. The thin-film transistor array panel as claimed in claim 5, wherein a portion of the polysilicon layer in the fifth region separates a portion of the polysilicon layer in the sixth region and a portion of the polysilicon layer in the fourth region; a portion of the polysilicon layer in the eighth region separates a portion of the polysilicon layer in the seventh region and a portion of the polysilicon layer in the ninth region.

11. The thin-film transistor array panel as claimed in claim 5, wherein the first ions have a constant doping concentration in the portion of the polysilicon layer in the sixth region; the second ions have a constant doping concentration in the portion of the polysilicon layer in the fourth region;

the third ions have a constant doping concentration in the portion of the polysilicon layer in the ninth region;

the fourth ions have a constant doping concentration in the portion of the polysilicon layer in the seventh region.

* * * * *

UNITED STATES PATENT AND TRADEMARK OFFICE
CERTIFICATE OF CORRECTION

PATENT NO. : 10,256,426 B2
APPLICATION NO. : 15/114864
DATED : April 9, 2019
INVENTOR(S) : Xiaowen Lv Page 1 of 1

It is certified that error appears in the above-identified patent and that said Letters Patent is hereby corrected as shown below:

On the Title Page

Item (73), ASSIGNEE:
Delete "SHENZHEN CHINA STAR OPTOELECTRONOCS TECHNOL09GY CO., LTD.," and
insert -- SHENZHEN CHINA STAR OPTOELECTRONICS TECHNOLOGY CO., LTD., --.

Signed and Sealed this
Second Day of June, 2020

Andrei Iancu
*Director of the United States Patent and Trademark Office*